US012647114B2

(12) United States Patent
Darmasetiawan

(10) Patent No.: US 12,647,114 B2
(45) Date of Patent: Jun. 2, 2026

(54) COMPUTER INPUT DEVICE

(71) Applicant: FLUX CONSOLIDATED PTY LTD,
Cherrybrook (AU)

(72) Inventor: Sebastian Darmasetiawan,
Cherrybrook (AU)

(73) Assignee: FLUX CONSOLIDATED PTY LTD,
Cherrybrook (AU)

( * ) Notice: Subject to any disclaimer, the term of this
patent is extended or adjusted under 35
U.S.C. 154(b) by 61 days.

(21) Appl. No.: 18/681,810

(22) PCT Filed: Sep. 7, 2022

(86) PCT No.: PCT/AU2022/051083
§ 371 (c)(1),
(2) Date: Feb. 6, 2024

(87) PCT Pub. No.: WO2023/035029
PCT Pub. Date: Mar. 16, 2023

(65) Prior Publication Data
US 2024/0340008 A1        Oct. 10, 2024

(30) Foreign Application Priority Data
Sep. 9, 2021        (AU) ................................. 2021902918

(51) Int. Cl.
H03K 17/972        (2006.01)
G06F 3/01        (2006.01)
(Continued)

(52) U.S. Cl.
CPC ......... *H03K 17/972* (2013.01); *G06F 3/0202*
(2013.01); *G06F 3/016* (2013.01);
(Continued)

(58) Field of Classification Search
CPC ... G06F 3/00; G06F 3/02; G06F 3/202; G06F
3/0213; G06F 3/0216; G06F 3/0219;
(Continued)

(56) References Cited

U.S. PATENT DOCUMENTS 7,812,828 B2    10/2010    Westerman et al.
9,978,543 B1 *    5/2018    Loo ...................... H03K 17/972
(Continued)

FOREIGN PATENT DOCUMENTS

WO        2015200726 A2        12/2015
WO        2016142881 A1        9/2016
WO        2018052871 A1        3/2018

OTHER PUBLICATIONS

International Preliminary Report on Patentability (Chapter II) dated
Jun. 19, 2023 from PCT Application No. PCT/AU2022/051083
(5pp).

(Continued)

*Primary Examiner* — Franklin D Balseca
(74) *Attorney, Agent, or Firm* — INNOVATION
CAPITAL LAW GROUP, LLP; Vic Lin

(57) ABSTRACT

An input device comprises an upper frame and a backing.
The upper frame is configured to engage tactile mechanisms
and the backing has an electronic display. The backing also
has positional sensors interfacing the tactile mechanisms to
detect operational positions thereof. Certain tactile mecha-
nism may be configured to allow display of the electronic
display therethrough and different types of tactile mecha-
nisms may be installed at various locations in embodiments.

45 Claims, 5 Drawing Sheets

(51) Int. Cl.
*G06F 3/02* (2006.01)
*H03K 17/97* (2006.01)

(52) U.S. Cl.
CPC ................ *H03K 2017/9706* (2013.01); *H03K*
*2017/9713* (2013.01)

(58) Field of Classification Search
CPC .... G06F 3/0224; G06F 3/0231; G06F 3/0238;
G06F 3/016; G06F 3/0202; H03K
2017/9706; H03K 2017/9713; H03K
17/965; H03K 17/97; H03K 17/972;
H01H 36/00; H01H 36/0006; H01H
36/0013; H01H 36/002; H01H 36/0026;
H01H 36/0033; H01H 36/004; H01H
36/006; H01H 36/0066; H01H 36/008;
H01H 36/0086; H01H 36/0093
See application file for complete search history.

(56) References Cited

U.S. PATENT DOCUMENTS

| | | | |
|---|---|---|---|
| 10,675,532 B2 * | 6/2020 | Soelberg | A63F 13/42 |
| 11,474,617 B2 * | 10/2022 | Norwalk | G06F 3/021 |
| 2004/0218963 A1 * | 11/2004 | Van Diepen | G06F 3/04886 |
| | | | 400/472 |
| 2010/0026635 A1 * | 2/2010 | Dimitrov | G06F 3/0219 |
| | | | 345/173 |
| 2011/0268487 A1 | 11/2011 | Larsen | |
| 2014/0144764 A1 | 5/2014 | Wilson et al. | |

OTHER PUBLICATIONS

International Search Report & Written Opinion dated Dec. 9, 2022 from PCT Application No. PCT/AU2022/051083 (27pp).

* cited by examiner

COMPUTER INPUT DEVICE

FIELD OF THE INVENTION

This invention relates generally to a computer input device and, more particularly, this invention relates to a computer input device comprising an upper frame engaging tactile mechanisms and a backing comprising an electronic display and positional sensors interfacing the tactile mechanisms to detect operational positions thereof.

SUMMARY OF THE DISCLOSURE

There is provided an input device comprising an upper frame engaging tactile mechanisms and a backing comprising an electronic display and positional sensors interfacing the tactile mechanisms to detect operational positions thereof.

The tactile mechanisms may comprise a key-type tactile mechanism comprising a key moveably engaged by the frame between raised and depressed positions and wherein the key is transparent so that a symbol displayed by the electronic display is visible therethrough and wherein a positional sensor interfaces the key-type tactile mechanism to detect between the raised and depressed positions.

The key may comprise a magnet and wherein the positional sensor detects the operational position of the key magnetically. The positional sensor may locate beneath the electronic display so as to not obscure the display thereof yet whilst being able to detect magnetic field of the magnet of the key therethrough.

The magnet of the key may be located on a side of the magnet so as to not obscure viewing therethrough. As such, most of the width of the key may be transparent.

The positional sensor may be a Hall effect sensor operably coupled to amplifying and thresholding circuitry to detect between raised and depressed positions of the key.

The magnet of the key may serve a dual purpose both in being used for positional detection by the positional sensor and for tactile feedback biasing. For example, the frame may comprise an aperture snugly fitting the key therein and having at least one corresponding attractive or repulsive magnets therein which bias the key to a raised position and/or provide tactile feedback.

The keyboard may comprise different types of tactile mechanisms, including rotary dial, trackball and slider-type tactile mechanisms.

In embodiments, the various types of tactile mechanism may be interchanged at locations of the upper frame, to thereby reconfigure the respective positioning of the different types of tactile mechanisms. For example, rotary dials may be substituted in place of keys, trackballs moved either side and the like.

The positional sensors at each location may be able to interface the different types of tactile mechanisms. For example, the positional sensors may be able to detect vertical magnetic field interaction of a key-type tactile mechanism as the key thereof moves vertically and also detect horizontal magnetic field interaction of a polarised or radially offset magnet rotating perpendicularly with respect to a rotational axis of a dial of the rotary dial-type mechanism.

The positional sensors may further be able to detect rotational magnetic interaction of rotating magnets coupled to rotors of the trackball-type mechanism.

The input device may detect the type of tactile mechanism installed at each location by reading and encoding thereof or alternatively by the type of parameters sensed by the positional sensor. For example, the positional sensor may comprise sensors which detect vertical magnetic interaction and horizontal magnetic interaction wherein readings from the sensors detecting vertical magnetic interaction may infer the installation of a key-type tactile mechanism as opposed to a rotary dial-type mechanism.

In embodiments, the upper frame is interchangeable with the backing so that different types of upper frames may be interchanged for different types of layouts.

A controller of input device may control at least one of the digital display and the positional sensors depending on the type of upper frame.

The upper frame may encode the type of upper frame which is read by the backing. In one embodiment, the upper frame magnetically encodes the type of frame in binary format using positions of magnets which are read by respectively positioned sensors. As such, three types of upper frames may be encoded using a two-digit binary encoding for example.

According to one aspect, there may be provided an input device comprising an upper frame, the upper frame configured to engage tactile mechanisms; and a backing comprising: an electronic display; and positional sensors interfacing the tactile mechanisms to detect operational positions thereof.

A tactile mechanism may comprise a magnet and wherein the positional sensor detects magnetic field flux of the magnet.

The positional sensor may be located beneath the electronic display to detect the magnetic field flux therethrough without visually obscuring electronic display.

The sensor may be a Hall effect sensor.

The input device may comprise more than one type of tactile mechanisms and wherein the upper frame may comprise a location at which the more than one type of tactile mechanism can be interchangeably installed.

The input device may be configured to detect a type of tactile mechanism installed at the location.

The backing may be configured to read a tactile type encoding of the tactile mechanisms.

The backing may be configured to detecting the type of installed tactile mechanism depending on positional sensor readings.

The backing may comprise at least two types of positional sensors for at least two types of respective tactile mechanisms and wherein the backing may be configured to detect the type of installed tactile mechanism depending on which of the two types of positional sensors may be activated by an installed tactile mechanism.

The input device may be configured to control the electronic display depending on the type of the tactile mechanism installed.

The backing may comprise at least two types of positional sensors at the location for at least two types of respective tactile mechanisms.

The two types of positional sensors may be configured to detect magnetic field flux horizontally and vertically with respect to the backing respectively.

A first of the positional sensors may comprise a sensor configured to detect magnetic field flux vertically with respect to the backing; and a further of the positional sensors may comprise two sensors configured to detect magnetic field flux horizontally with respect to the backing and wherein the input device may be configured to determine rotational orientation by magnetic field flux strength measured respectively by the two sensors.

The upper frame may be interchangeable with the backing.

The input device may comprise at least two types of upper frames and wherein the backing may be configured to detect a type of installed upper frame.

The input device may be configured to control the electronic display depending on the type of installed upper frame.

The input device may be configured to display different symbols depending on the type of installed upper frame.

The backing may be configured to read an upper frame encoding to detect the type of installed upper frame.

The encoding may be a binary encoding.

The binary encoding may be encoded by magnet position and wherein the backing may comprise respectively positioned magnetic sensors to read the binary encoding.

The tactile mechanisms comprise a key-type tactile mechanism comprising a key moveably engaged by the frame between raised and depressed positions and wherein the key may be transparent so that a symbol displayed by the electronic display may be visible therethrough and wherein a positional sensor interfaces the key-type tactile mechanism to detect between the raised and depressed positions. Most of the width of the key could be transparent.

The key may comprise a magnet and wherein the positional sensor detects magnetic field flux of the magnet to determine operational position of the key.

The positional sensor may be located beneath the electronic display to detect the magnetic field therethrough without visually obscuring the digital display. The sensor may be a Hall effect sensor.

Most of the width of the key could be transparent and wherein the magnet may be located at a side of the key.

The frame may comprise a magnet which at least one of attracts and repels the magnet at the side of the key to bias the operational position of the key.

The magnets may magnetically repel each other and move closer together when the key moves towards the depressed position.

The side magnets may magnetically attract each other and move closer together when the key moves towards the raised position.

The tactile mechanisms may comprise a rotary dial-type tactile mechanism.

A dial of the rotary dial-type tactile mechanism may rotate a magnet with respect to a rotational axis of the dial.

The positional sensor may detect magnetic field flux of the magnet horizontally with respect to the backing.

The magnet may be polarised.

The magnet may be radially offset with respect to the rotational axis.

The positional sensor may comprise two radially offset positional sensors and wherein the input device may be configured to detect a rotary position of the dial by relative magnetic field flux strength detected thereby.

The magnet may be radially offset with respect to the rotational axis and wherein the positional sensor may comprise a quadrant of radially offset positional sensors and wherein the input device may be configured to detect a rotary quadrant of the dial by the two adjacent positional sensors detecting most magnetic field flux and further the position of the dial within the rotary quadrant by relative magnetic field flux strength detected thereby.

The rotary dial-type tactile mechanism may comprise a transparent core having planar lower and upper surfaces.

The lower surface may be exposed directly to the electronic display.

The transparent core may be elongate and acts as a waveguide to reflect light from a symbol displayed by electronic display along the length of the waveguide.

The rotary dial-type tactile mechanism may hold at least one radially offset magnet adjacent the core and wherein the backing may comprise at least one radially offset sensor to detect magnetic field flux of the magnet.

The tactile mechanisms may comprise a track ball-type tactile mechanism.

The positional sensor may comprise orthogonal rotors having magnets and wherein the positional sensor detects rotational magnetic field flux with the magnets of the rotors.

The tactile mechanisms comprise a slider-type tactile mechanism which may comprise a shuttle which runs along a track.

The shuttle may hold a permanent magnet which may be detected by discrete positional sensors arranged along the track.

The positional sensors may be Hall effect sensors.

The input device may further comprise a linear motor mechanism configured to move the shuttle.

The linear motor mechanism may comprise a plurality of electromagnetic coils arranged along the track which may be energised to at least one of attract or repel the shuttle.

The input device may be configured to determine a position of the slider and energise an electromagnetic coil to one side of the shuttle to attract the shuttle.

The input device may be configured to determine a position of the slider and energise an electromagnetic coil under the shuttle repel the shuttle.

The input device may be configured to alternately operate the electromagnetic coils and the sensors.

Other aspects of the invention are also disclosed.

BRIEF DESCRIPTION OF THE DRAWINGS

Notwithstanding any other forms which may fall within the scope of the present invention, preferred embodiments of the disclosure will now be described, by way of example only, with reference to the accompanying drawings in which.

DESCRIPTION OF EMBODIMENTS

Figure 1:
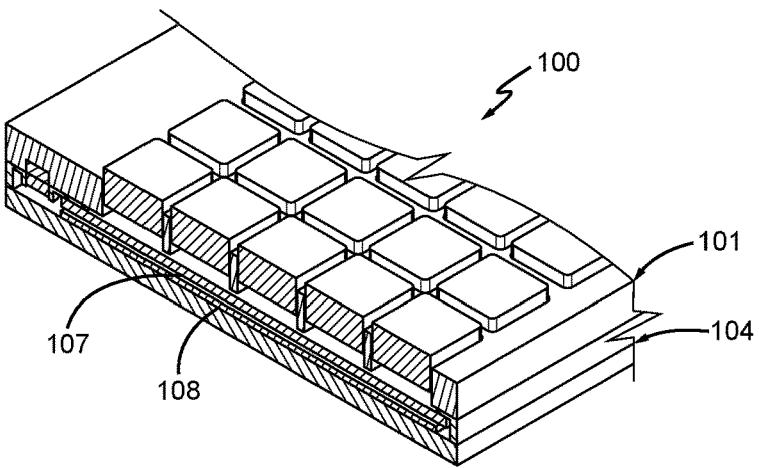
FIG. 1 shows a perspective cross-sectional view of an input device in accordance with an embodiment.
Figure 2:
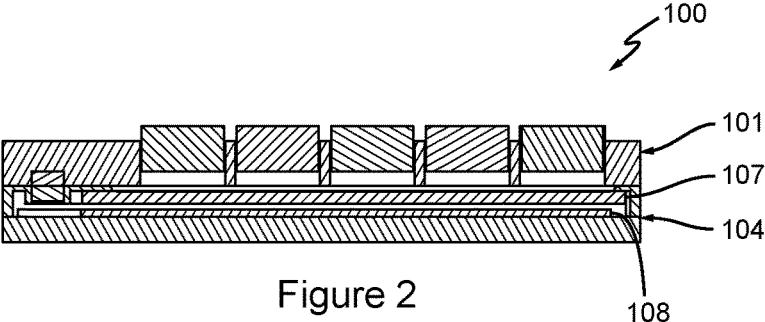
FIG. 2 shows a side elevation view of the input device.

An input device 100 comprises an upper frame 101 comprising at least one tactile mechanism.

The input device 100 further comprises a backing 104 comprising an electronic display 107 and sensor board 108.

The electronic display 107 may use LCD, LED, e-paper display technology or the like.

The sensor board 108 may comprise a plurality of positional sensors 106 operably interfacing the tactile mechanisms to detect operational positions of the tactile mechanisms.

A transparent screen 109 may protect the electronic display 107 thereunderneath.

Figure 4:
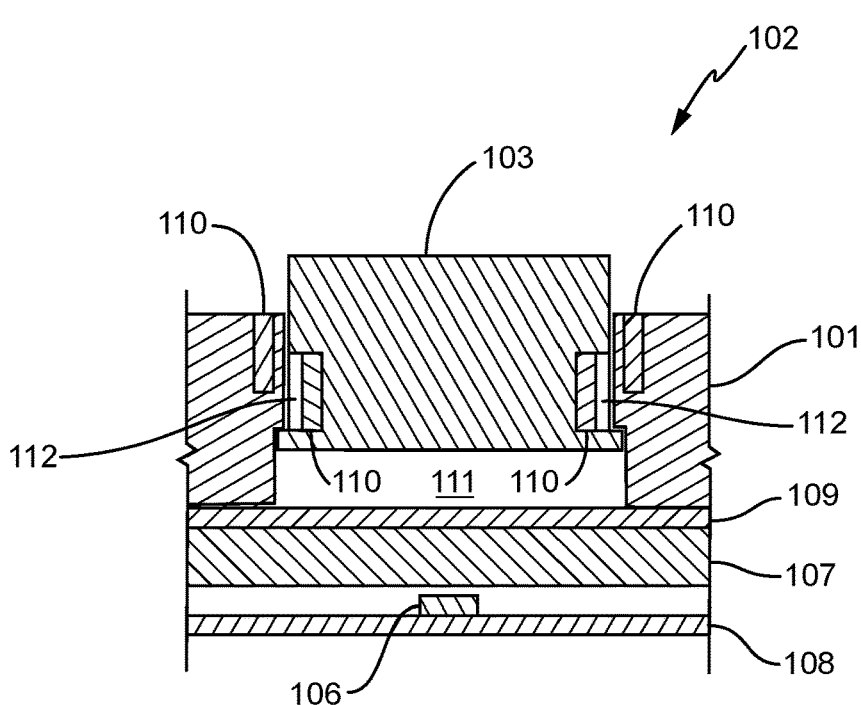
FIG. 4 shows a key-type tactile mechanism in accordance with an embodiment.

FIG. 4 shows wherein the tactile mechanism is a key-type tactile mechanism 102 comprising a transparent key 103 movably engaged by the frame 101 between raised and depressed positions.

Preferably, most of the width of the key 103 is transparent so as to maximise visibility of symbols displayed dynamically by the electronic display 107 thereunderneath.

The positional sensor 106 may detect operational positions of the tactile mechanisms magnetically. Specifically, with reference to FIG. 4, the key 103 may comprise at least one magnet 110 and wherein the positional sensor 106 detects a magnetic field flux of the magnet 110. For example, when the key 103 is depressed, the sensor 106 detects an increase (i.e., rate of change) of the magnetic field flux of the magnets 110 indicative of a keypress. Alternatively, the sensor 106 may detect the magnetic field flux exceeding a threshold.

The sensor 106 may be configured to detect the magnetic field flux of both magnets 110 on both sides of the key 103 to thereby avoid interference from adjacent keys. For example, the sensor 106 may be configured to detect a magnetic field flux greater than a threshold and wherein both magnets 110 are required to generate the magnetic field flux greater than the threshold.

As further shown in FIG. 4, the positional sensor 106 may locate beneath the electronic display 107 so as to not obscure the display thereof but yet be able to detect a magnetic field flux of the magnets 110 therethrough.

The positional sensor 106 may comprise a Hall effect sensor operably coupled to circuitry to amplify signals for magnetic field flux rate-of-change or thresholding detection to detect between the raised and depressed positions of the key 103.

As is shown in FIG. 4, the magnet 110 is preferably located against or recessed in a side of the key so as to not obscure visibility through the body of the key 103. The key 103 may comprise side channels 112 fitting the side magnets 110 discreetly therein.

These magnets 110 may serve a dual purpose in being sensed by the positional sensor 106 and biasing the key position.

Specifically, the frame 101 may comprise an aperture 111 snugly fitting the key 103 therein. The key 103 and the aperture 111 may have respective magnetically interacting side magnets 110.

Adjacent side magnets 110 may magnetically repel each other and coincide in vertical position when the key 103 moves towards the depressed position. As such, the magnetic repulsion generated by adjacent side magnets 110 biases the key 103 towards the raised position.

Alternatively, the side magnets 110 may magnetically attract each other and coincide when the key 103 moves towards the raised position. As such, the magnetic attraction of adjacent magnets 110 biases the key 103 towards the raised position.

In embodiments, the frame 101 comprises a vertical arrangement of side magnets 110 of opposite polarity to both repel and attract the key 103 towards the raised position. Specifically, this vertical arrangement side magnets 110 of the frame 101 may comprise lower repulsive side magnets 110 and upper attractive magnets 110 which respectively repel and attract the side magnets 110 of the key 103 to bias the key 103 to the raised position.

In embodiments, tactile mechanisms may be interchangeably installed in various locations of the upper frame 101. For example, the upper frame 101 may comprise a plurality of uniformly sized and shaped apertures into which various tactile mechanisms can be interchanged.

As such, keyboard arrangements of different types of tactile mechanisms can be installed at various locations of the upper frame 101. For example, a key-type tactile mechanism 102 may be interchanged with a rotary dial-type mechanism 113 shown in FIG. 5 or a trackball-type mechanism 114 shown in FIG. 6. In embodiments a plurality of key-type tactile mechanisms 102 may be interchanged with a slider-type tactile mechanism 125 shown in FIG. 11.

In accordance with this embodiment, the input device 100 may detect the type of installed tactile mechanism 102 so as to be able to determine how to detect operational positions thereof using one or more available sensors 106.

In embodiments, a single positional sensor 106 may be usable to determine operational positions of more than one tactile mechanism. In further embodiments, the backing may comprise a plurality of positional sensors 106, each configured to detect a specific type of tactile mechanism. When detecting the type of installed mechanism, the input device 100 may determine which positional sensor 106 to monitor.

In embodiment, the tactile mechanisms may encode of the type of tactile mechanism and wherein the encoding is read by the input device.

Alternatively, the type of installed tactile mechanism may be inferred from readings from the positional sensors 106. For example, with reference to FIG. 4 wherein the tactile mechanism comprises a key-type tactile mechanism, the positional sensor 106 is able to detect vertical magnetic field flux as the key 103 moves vertically with respect to the positional sensor 106, from which it can be inferred that a key-type tactile mechanism 102 is installed. Alternatively, with reference to FIG. 5 wherein the dial-type mechanism 113 is installed, the orthogonally and radial offset positional sensors 106 may detect rotation of a magnet 116 thereof (which may be a polarised magnet in embodiments).

As such, a controller of the input device 100 is able to control at least one of the display of the electronic display 107 and the operation of the respective positional sensors 106 depending on the type of tactile mechanism installed.

For example, when detecting the installation of a key-type mechanism 102, the input device 100 may display a key symbol using the electronic display 107 and use the positional sensor 106 shown in FIG. 4 to detect the vertical position of the key 103.

Alternatively, when detecting installation of the rotary-type mechanism 113, input device may control the electronic display 107 to display a dial indicator (such as a dial marking or colour gradient determined by the rotary position of the dial 115) and to use the orthogonally and radial offset sensors 117.

In embodiments, different types of tactile mechanisms comprise magnets and wherein positional sensors 106 at each location are able to detect respective magnetic field flux of the different types of tactile mechanisms.

For example, with reference to FIG. 4 wherein the tactile mechanism comprises a key-type tactile mechanism 102, the positional sensor 106 is able to detect vertical magnetic field flux as the key 103 moves vertically with respect to the positional sensor 106.

Figure 5:
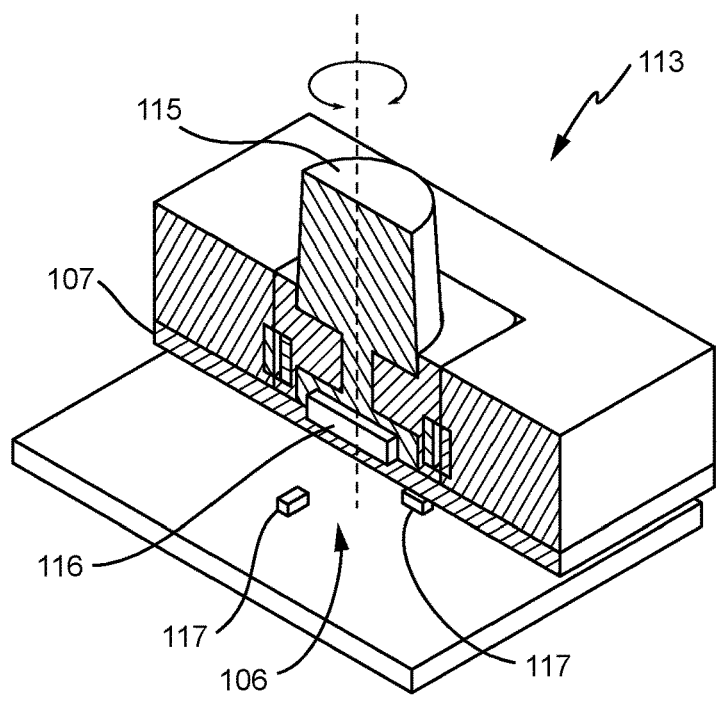
FIG. 5 shows a rotary dial-type tactile mechanism in accordance with an embodiment.

Further, with reference to FIG. 5 wherein the tactile mechanism comprises a rotary dial-type mechanism 113, a dial 115 thereof may rotate a polarised magnet 116 and wherein the positional sensor 106 is able to detect horizontal magnetic field flux with the polarised magnet 116.

As is shown in FIG. 5, the positional sensor 106 may comprise radially and orthogonally positioned magnetic sensors 117 and wherein the input device controller is able to determine the rotary position of the dial 115 by the respective magnetic field strengths detected thereby. For example, the magnetic flux detected by one of the magnetic sensors 117 would be greatest when the polarised magnet 116 is orientated towards it and wherein input device would be able to determine rotary position of the dial 115 by respective magnetic field flux strength detection of each sensor 117. In embodiments, the magnetic sensors 117 comprise a quadrant of sensors and wherein the magnet is radially offset towards one edge of the dial. As such, the input device 100 would be able to detect the quadrant position of the dial 115 by determining which two sensors 106 detect the greatest magnetic flux and the determining the exact position within the quadrant by detecting the respective magnetic flux field strength between these two sensors 115.

Figure 6:
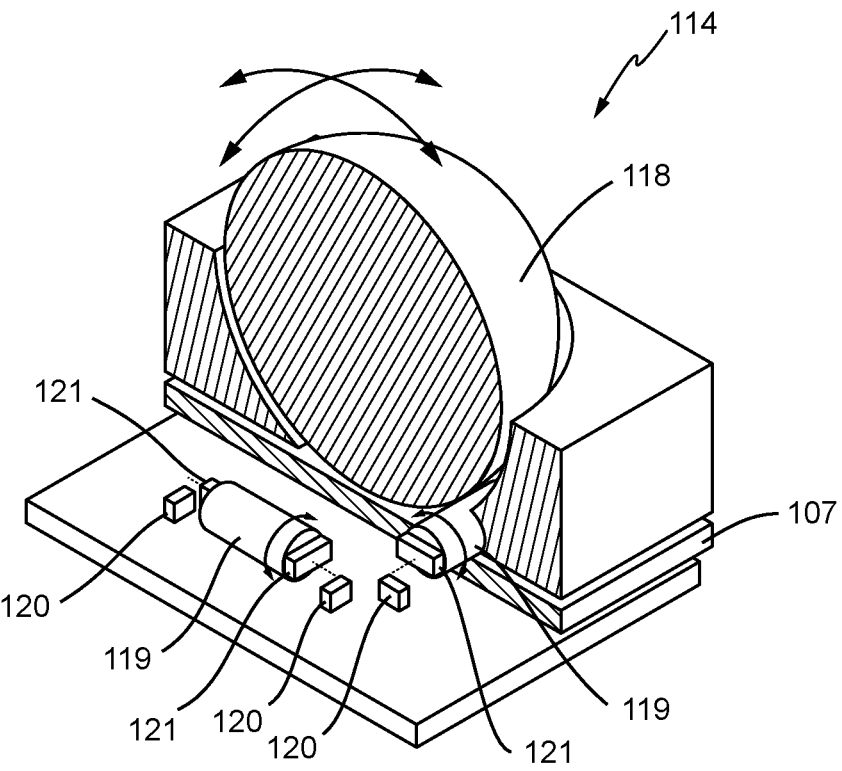
FIG. 6 shows a trackball-type tactile mechanism in accordance with an embodiment.

With reference to FIG. 6 wherein the tactile mechanism comprises a trackball-type mechanism 114, the mechanism 114 may comprise a trackball 118 turning orthogonal rotors 119. In this regard, the positional sensor 106 may comprise magnetic sensors 120 which detect rotation of magnets 121 turning with respect to a rotational axis of the rotor 119.

As is further shown in FIG. 6, the magnets 121 located either side of the rotor 119 may be polarised and offset orthogonally so that the input device controller is similarly able to detect a rotation of the rotor 119 by differentiating magnetic fields detected by the magnetic sensors 120 induced by the orthogonally offset polarised magnets 121.

Figure 3:
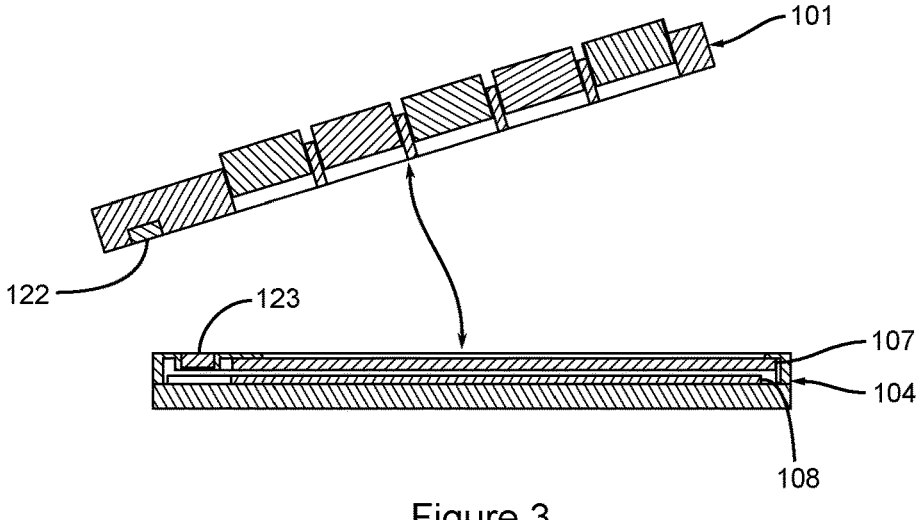
FIG. 3 shows interchangeability of an upper frame with respect to a backing of the input device in accordance with an embodiment.
Figure 7:
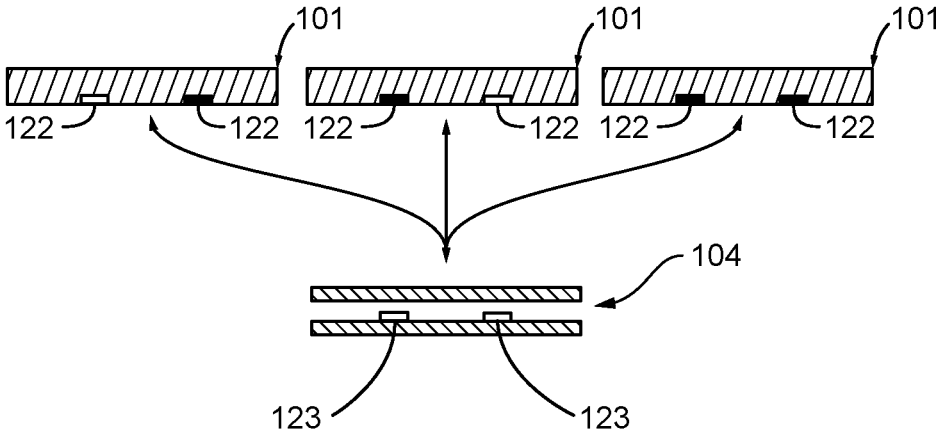
FIG. 7 illustrates binary encoding of different types of upper frames.

As is shown in FIGS. 3 and 7, the upper frame 101 may be interchangeable with the backing 101.

The input device 100 may be able to detect the type of the upper frame 101 attached to the backing 104 so as to be able to control at least one of the electronic display 107 and positional sensors 106 accordingly.

The upper frame 101 may comprise a type encoding readable by the backing 104. With reference to FIG. 3, the type encoding may be encoded in binary by appropriately positioned magnets 122. Furthermore, the backing 104 may comprise respective magnetic sensors 123 which sense the respective positions of the magnets 122. FIG. 7 shows how three different types of frames 101 may be encoded using a two-digit binary encoding.

In embodiments, the input device 100 may employ sensors 106 other than Hall effect sensors that detect operational positions of the tactile mechanisms.

Figure 8:
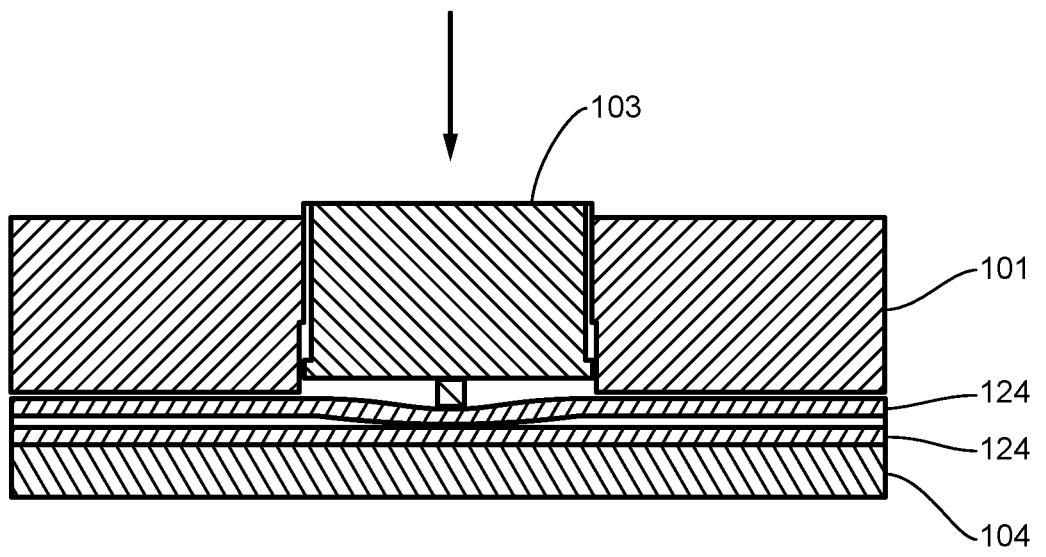
FIG. 8 shows an alternative positional sensing mechanism.

For example, FIG. 8 shows the alternate sensing mechanisms employing a flexible film 124. In the embodiments shown, a pair of transparent conductive flexible films 124 (such as ITO coated PET films 124) make contact with each other when the key 103 is depressed.

Alternatively, a single grounded conductive flexible film 124 may overlay a capacitive touchscreen bonded to the display 107.

Figure 10:
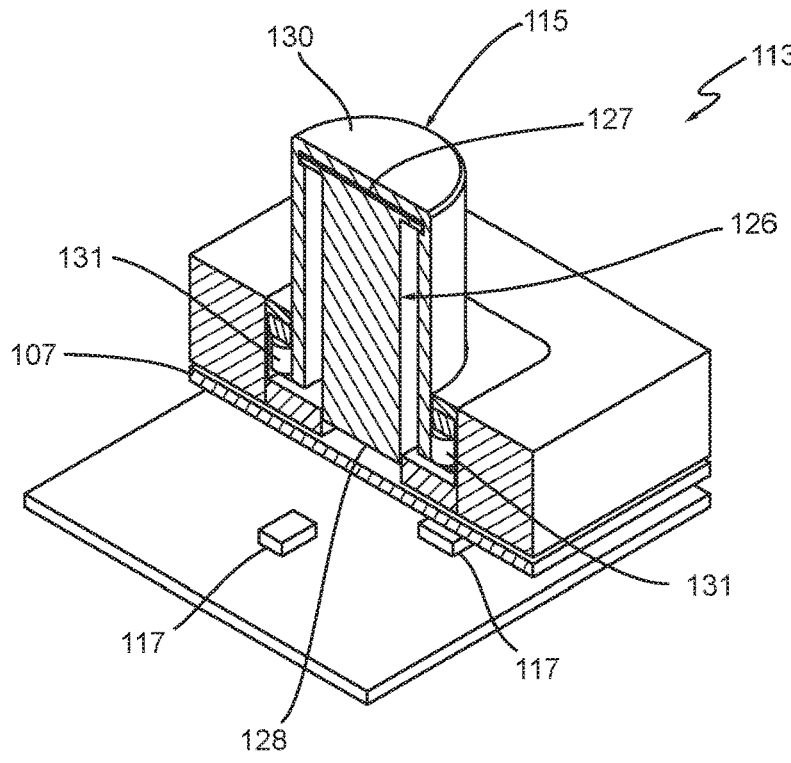
FIG. 10 shows a rotary dial-type tactile mechanism comprising a transparent core of FIG. 9 in accordance with an embodiment.

FIG. 10 shows a further embodiment of the dial-type tactile mechanism 113 which is designed to maximise viewability symbols dynamically displayed by the electronic display 107 through the mechanism 113.

In accordance with this embodiment, the mechanism 113 comprises a transparent core 126 having planar parallel top and bottom surfaces 127, 128.

Figure 9:
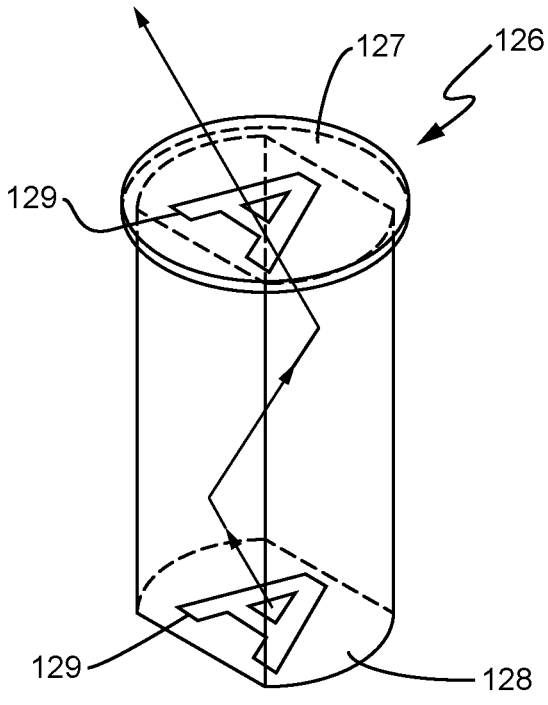
FIG. 9 shows a transparent core of a rotary dial-type tactile mechanism in accordance with an embodiment.

FIG. 9 illustrates how the transparent core 126 acts as a waveguide wherein light from a symbol 129 displayed by the electronic display 107 at the bottom surface 108 is reflected along the core 126 to strike the upper surface 127. Light emanating from the upper surface 127 in this way may increase the viewing angle of the symbol 129.

Alternatively, the upper surface 127 may be opaque so that the light of the symbol 129 is diffused therethrough, thereby giving the impression that the symbol 129 is displayed at the upper surface 127

FIG. 10 illustrates how the transparent core 126 may be encapsulated within an outer body 130 to thereby expose the bottom surface 128 directly to the electronic display 107. Furthermore, the body 130 may engage side magnets 131 which are detected by the radially and orthogonally offset sensors 117 thereunderneath in the aforedescribed manner.

Figure 11:
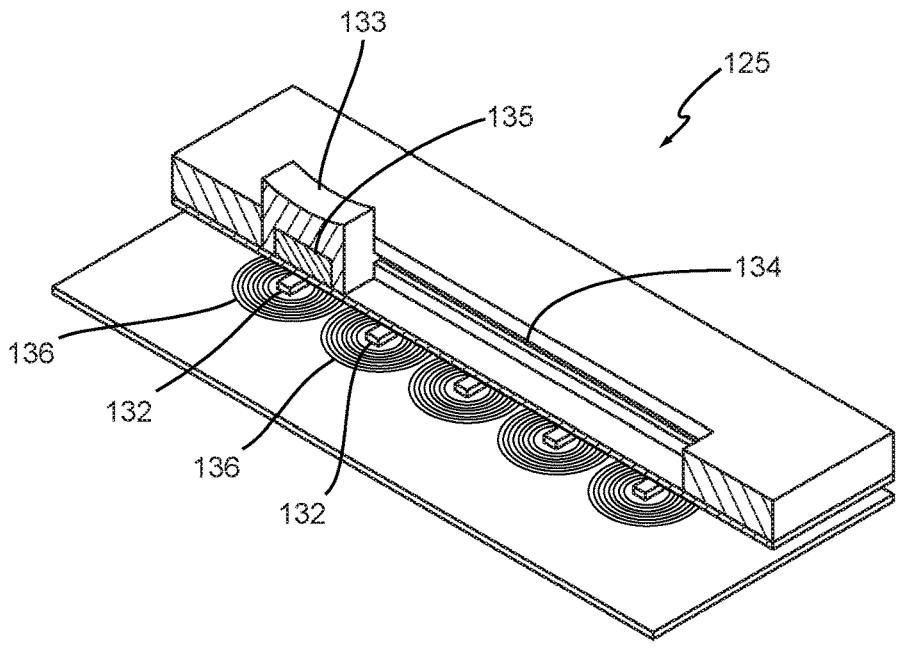
FIG. 11 shows a slider-type tactile mechanism in accordance with an embodiment.

FIG. 11 shows the slider-type tactile mechanism 125 comprising a shuttle 133 which runs along a track 134. The shuttle 133 may comprise side rails which slidably engaged within respective side rail engagements of the track 134.

The shuttle 133 may hold a permanent magnet 135 which is detected by Hall effect positional sensors 132 thereunderneath. As such, input device may be able to detect the position of the shuttle 133 with a high degree of precision by measuring the respective magnetic field flux strength detected by the sensors 132.

In further embodiments, the input device 100 may move the position of the slider 133 using a linear motor mechanism. In the embodiment shown, the linear motor mechanism comprises a plurality of electromagnetic coils 136 which may be energised to attract and/or repel the magnet 135.

For example, to move the shuttle 133 along the track, the input device 100 may determine the position of the slider 133 and then energise an electromagnetic coil 136 to one side of the shuttle 133 to attract the permanent magnet 135 thereof. Additionally, in embodiments, the input device 100 may energise an electromagnetic coil 136 directly underneath the shuttle 133 with current applied in an opposite direction to repel the permanent magnet 135 thereof.

The input device may be configured to alternately operate the electromagnetic coils 136 and sensing of the sensors 132 to avoid electromagnetic interference.

In embodiments, the dial 115 may be clickable in addition to being rotatable. Specifically, the physical arrangement shown in FIG. 10 may allow the vertical movement of the dial 115. The rotational orientation of the dial 115 may be detected by horizontal magnetic flux interactions detected by the sensors 117 whereas the vertical offset may be detected by vertical magnetic flux interactions detected by the sensors 117.

The present input devices may be integrated in computer devices such as laptops or the like or may represent a peripheral input device connected to a computing device, such as by way of a USB serial connection or the like.

The foregoing description, for purposes of explanation, used specific nomenclature to provide a thorough understanding of the invention. However, it will be apparent to one skilled in the art that specific details are not required in order to practise the invention. Thus, the foregoing descriptions of specific embodiments of the invention are presented for purposes of illustration and description. They are not intended to be exhaustive or to limit the invention to the precise forms disclosed as obviously many modifications and variations are possible in view of the above teachings. The embodiments were chosen and described in order to best explain the principles of the invention and its practical applications, thereby enabling others skilled in the art to best utilize the invention and various embodiments with various modifications as are suited to the particular use contemplated. It is intended that the following claims and their equivalents define the scope of the invention.

The invention claimed is:

1. An input device comprising:

an upper frame, the upper frame configured to engage tactile mechanisms; and a backing comprising:

an electronic display; and positional sensors interfacing the tactile mechanisms to detect operational positions thereof, wherein:

the tactile mechanisms comprise a key-type tactile mechanism comprising a key moveably engaged by the frame between raised and depressed positions and wherein the key is transparent so that a symbol displayed by the electronic display is visible therethrough and wherein a first positional sensor of the positional sensors interfaces the key-type tactile mechanism to detect between the raised and depressed positions;

the frame comprises a first magnet which attracts or repels a second magnet at the side of the key to bias an operational position of the key;

wherein the first positional sensor detects magnetic field flux of the second magnet to determine the operational position of the key; and the first positional sensor is located beneath the electronic display.

2. The input device as claimed in claim 1, wherein the first positional sensor is a Hall effect sensor.

3. The input device as claimed in claim 1, wherein the input device comprises more than one type of tactile mechanisms and wherein the upper frame comprises a location at which the more than one type of tactile mechanisms can be interchangeably installed.

4. The input device as claimed in claim 3, wherein the input device is configured to detect a type of a first tactile mechanism installed at the location.

5. The input device as claimed in claim 4, wherein the backing is configured to read a tactile type encoding of the first tactile mechanism installed at the location.

6. The input device as claimed in claim 4, wherein the backing is configured to detect the type of the first tactile mechanism installed at the location depending on positional sensor readings.

7. The input device as claimed in claim 6, wherein the backing comprises at least two types of positional sensors for at least two types of respective tactile mechanisms and wherein the backing is configured to detect the type of the first tactile mechanism installed at the location depending on which of the two types of positional sensors is activated by an installed tactile mechanism.

8. The input device as claimed in claim 4, wherein the input device is configured to control the electronic display depending on the type of the first tactile mechanism installed at the location.

9. The input device as claimed in claim 3, wherein the backing comprises at least two types of positional sensors at the location for at least two types of respective tactile mechanisms.

10. The input device as claimed in claim 9, wherein the two types of positional sensors are configured to detect magnetic field flux horizontally and vertically with respect to the backing respectively.

11. The input device as claimed in claim 1, wherein the upper frame is interchangeable with the backing.

12. The input device as claimed in claim 11, wherein the input device comprises at least two types of upper frames and wherein the backing is configured to detect a type of installed upper frame.

13. The input device as claimed in claim 12, wherein the input device is configured to control the electronic display depending on the type of installed upper frame.

14. The input device as claimed in claim 13, wherein the input device is configured to display different symbols depending on the type of installed upper frame.

15. The input device as claimed in claim 12, wherein the backing is configured to read an upper frame encoding to detect the type of installed upper frame.

16. The input device as claimed in claim 15, wherein:

a second positional sensor comprises a sensor configured to detect magnetic field flux vertically with respect to the backing; and a third positional sensor comprises two sensors configured to detect magnetic field flux horizontally with respect to the backing and wherein the input device is configured to determine rotational orientation by magnetic field flux strength measured respectively by the two sensors of the third positional sensor.

17. The input device as claimed in claim 15, wherein the encoding is a binary encoding.

18. The input device as claimed in claim 17, wherein the binary encoding is encoded by magnet position and wherein the backing comprises respectively positioned magnetic sensors to read the binary encoding.

19. The input device as claimed in claim 1, wherein most of a width of the key is transparent.

20. The input device as claimed in claim 1, wherein most of a width of the key is transparent and wherein the second magnet is located at a side of the key.

21. The input device as claimed in claim 1, wherein the first and second magnets magnetically repel each other and move closer together when the key moves towards the depressed position.

22. The input device as claimed in claim 1, wherein the magnets magnetically attract each other and move closer together when the key moves towards the raised position.

23. The input device as claimed in claim 1, wherein the tactile mechanisms comprise a rotary dial-type tactile mechanism.

24. The input device as claimed in claim 23, wherein a dial of the rotary dial-type tactile mechanism rotates a third magnet with respect to a rotational axis of the dial.

25. The input device as claimed in claim 24, wherein the dial is engaged to allow both vertical movement and rotation thereof so that the dial is both clickable and rotatable.

26. The input device as claimed in claim 25, wherein the backing comprises positional sensors configured to detect rotational orientation of the dial by horizontal magnetic flux and vertical offset of the dial by vertical magnetic flux.

27. The input device as claimed in claim 24, wherein the first positional sensor detects magnetic field flux of the third magnet horizontally with respect to the backing.

28. The input device as claimed in claim 27, wherein the third magnet is polarised.

29. The input device as claimed in claim 27, wherein the third magnet is radially offset with respect to the rotational axis.

30. The input device as claimed in claim 27, wherein the first positional sensor comprises two radially offset positional sensors and wherein the input device is configured to detect a rotary position of the dial by relative magnetic field flux strength detected thereby.

31. The input device as claimed in claim 27, wherein the third magnet is radially offset with respect to the rotational axis and wherein the first positional sensor comprises a quadrant of radially offset positional sensors and wherein the input device is configured to detect a rotary quadrant of a dial by two adjacent positional sensors detecting most magnetic field flux and further the position of the dial within the rotary quadrant by relative magnetic field flux strength detected thereby.

32. The input device as claimed in claim 23, wherein the rotary dial-type tactile mechanism comprises a transparent core having planar lower and upper surfaces.

33. The input device as claimed in claim 32, wherein the lower surface is exposed directly to the electronic display.

34. The input device as claimed in claim 33, wherein the transparent core is elongate and acts as a waveguide to reflect light from a symbol displayed by electronic display along a length of the waveguide.

35. The input device as claimed in claim 33, wherein the rotary dial-type tactile mechanism holds at least one radially offset magnet adjacent to the core and wherein the backing comprises at least one radially offset sensor to detect magnetic field flux of the at least one radially offset magnet adjacent to the core.

36. The input device as claimed in claim 1, wherein the tactile mechanisms comprise a track ball-type tactile mechanism.

37. The input device as claimed in claim 36, wherein the first positional sensor comprises orthogonal rotors having magnets and wherein the first positional sensor detects rotational magnetic field flux with the magnets of the rotors.

38. The input device as claimed in claim 1, wherein the tactile mechanisms comprise a slider-type tactile mechanism which comprises a shuttle which runs along a track.

39. The input device as claimed in claim 38, wherein the shuttle holds a permanent magnet which is detected by discrete positional sensors arranged along the track.

40. The input device as claimed in claim 39, wherein the discrete positional sensors arranged along the track are Hall effect sensors.

41. The input device as claimed in claim 38, further comprising a linear motor mechanism configured to move the shuttle.

42. The input device as claimed in claim 41, wherein the linear motor mechanism comprises a plurality of electromagnetic coils arranged along the track which are energised to at least one of attract or repel the shuttle.

43. The input device as claimed in claim 42, wherein the input device is configured to determine a position of the slider-type tactile mechanism and energise an electromagnetic coil to one side of the shuttle to attract the shuttle.

44. The input device as claimed in claim 42, wherein the input device is configured to determine a position of the slider-type tactile mechanism and energise an electromagnetic coil under the shuttle repel the shuttle.

45. The input device as claimed in claim 42, wherein the input device is be configured to alternately operate the electromagnetic coils and the positional sensors.

* * * * *